(12) United States Patent
Suk et al.

(10) Patent No.: US 12,519,048 B2
(45) Date of Patent: Jan. 6, 2026

(54) SEMICONDUCTOR PACKAGE

(71) Applicant: SAMSUNG ELECTRONICS CO., LTD., Suwon-si (KR)

(72) Inventors: Kyounglim Suk, Suwon-si (KR);
Jihwang Kim, Suwon-si (KR);
Suchang Lee, Suwon-si (KR);
Hyeonjeong Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 377 days.

(21) Appl. No.: 18/212,939

(22) Filed: Jun. 22, 2023

(65) Prior Publication Data

US 2024/0113001 A1    Apr. 4, 2024

(30) Foreign Application Priority Data

Sep. 30, 2022  (KR) ........................ 10-2022-0124807

(51) Int. Cl.
*H01L 23/495*    (2006.01)
*H01L 23/00*     (2006.01)
(Continued)

(52) U.S. Cl.
CPC .... *H01L 23/49822* (2013.01); *H01L 23/3121* (2013.01); *H01L 23/481* (2013.01);
(Continued)

(58) Field of Classification Search
CPC ........... H01L 23/49822; H01L 23/3121; H01L 23/481; H01L 23/49811; H01L 23/642; H01L 24/16; H01L 25/0657; H01L 2224/16227; H01L 2221/68327; H01L 2225/06586; H01L 21/486; H01L 21/561; H01L 21/568; H01L 2225/06517; H01L 2225/06541; H01L 2221/68345;
(Continued)

(56) References Cited

U.S. PATENT DOCUMENTS 10,381,302 B2    8/2019  Shih et al.
10,396,044 B2    8/2019  Nakagawa et al.
(Continued)

FOREIGN PATENT DOCUMENTS

KR    10-2009-0071370 A    7/2009

*Primary Examiner* — Theresa T Doan
(74) *Attorney, Agent, or Firm* — Sughrue Mion, PLLC

(57) ABSTRACT

A semiconductor package includes: a first redistribution structure including at least one first redistribution layer and at least one first insulating layer; a first semiconductor chip electrically connected to the at least one first redistribution layer and disposed on a first surface of the first redistribution structure; a second semiconductor chip disposed on an upper surface of the first semiconductor chip; a first encapsulant disposed on a second surface of the first redistribution structure opposite the first surface of the first redistribution layer; first conductive posts electrically connected to the first semiconductor chip and penetrating the first encapsulant; and under bump metallurgy (UBM) structures disposed on a lower surface of the first encapsulant, wherein at least a portion of the UBM structures overlap at least a portion of the first conductive posts in a penetration direction of the first conductive posts and are connected to the first conductive posts.

20 Claims, 15 Drawing Sheets

(51) Int. Cl.
  *H01L 23/31* (2006.01)
  *H01L 23/48* (2006.01)
  *H01L 23/498* (2006.01)
  *H01L 23/64* (2006.01)
  *H01L 25/065* (2023.01)
(52) U.S. Cl.
  CPC ...... *H01L 23/49811* (2013.01); *H01L 23/642* (2013.01); *H01L 24/16* (2013.01); *H01L 25/0657* (2013.01); *H01L 2224/16227* (2013.01)
(58) Field of Classification Search
  CPC ............. H01L 21/6835; H01L 23/3128; H01L 23/5383; H01L 23/5385; H01L 23/5389; H01L 25/16; H01L 23/49816; H01L 23/64; H01L 24/04; H01L 24/20; H01L 24/23; H01L 2224/0401; H01L 2224/0613; H01L 2225/06513; H01L 2225/06527

USPC ......................................................... 257/668
See application file for complete search history.

(56) References Cited

U.S. PATENT DOCUMENTS

| | | |
|---|---|---|
| 10,833,002 B2 | 11/2020 | Kim |
| 10,872,852 B2 | 12/2020 | Shih |
| 2009/0170242 A1 | 7/2009 | Lin et al. |
| 2012/0248439 A1* | 10/2012 | Lee .................. H01L 23/49838 257/777 |
| 2013/0044554 A1* | 2/2013 | Goel ..................... G11C 29/816 365/200 |
| 2020/0381405 A1 | 12/2020 | Patil et al. |
| 2022/0199520 A1 | 6/2022 | Kang et al. |

* cited by examiner

SEMICONDUCTOR PACKAGE

CROSS-REFERENCE TO RELATED APPLICATION(S)

This application claims priority to Korean Patent Application No. 10-2022-0124807, filed on Sep. 30, 2022 in the Korean Intellectual Property Office, the disclosure of which is incorporated by reference herein in its entirety.

BACKGROUND

The disclosure relates to a semiconductor package.

A semiconductor chip may be implemented as a semiconductor package such as a wafer level package (WLP) or a panel level package (PLP), and a semiconductor package may be used as an electronic component of a device.

A semiconductor package may include a redistribution layer for electrically connecting a semiconductor chip to a device or a printed circuit board. The redistribution layer may have a structure in which redistribution layers, implemented to be finer than wirings of wiring layers of a general printed circuit board, are extended horizontally.

The redistribution layer may be electrically connected to bumps to extend an electrical connection path vertically, and under bump metallurgy (UBM) may improve electrical connection efficiency between a redistribution layer and a bump.

Since a system provided by a semiconductor chip has become increasingly complex and performance of a semiconductor chip has gradually increased, higher integration of a semiconductor package may be required, and a smaller size of the semiconductor package may be required for unit performance. However, as the integration density of the semiconductor package increases or the size for the same unit performance decreases, the degree of difficulty in securing reliability of the semiconductor package may increase. For example, a UBM closely connected to a bump may become a bottleneck in securing reliability of a semiconductor package.

SUMMARY

One or more example embodiments provide a semiconductor package having a structure which may increase integration density or which may reduce a size for unit performance, and may also increase reliability on an absolute basis or on a relative basis given a particular unit price or size).

According to an aspect of an example embodiment, a semiconductor package, includes: a first redistribution structure comprising at least one first redistribution layer and at least one first insulating layer; a first semiconductor chip electrically connected to the at least one first redistribution layer and disposed on a first surface of the first redistribution structure; a second semiconductor chip disposed on an upper surface of the first semiconductor chip; a first encapsulant disposed on a second surface of the first redistribution structure opposite the first surface of the first redistribution layer; first conductive posts electrically connected to the first semiconductor chip and penetrating the first encapsulant; and under bump metallurgy (UBM) structures disposed on a lower surface of the first encapsulant, wherein at least a portion of the UBM structures overlap at least a portion of the first conductive posts in a penetration direction of the first conductive posts and are connected to the first conductive posts.

According to an aspect of an example embodiment, a semiconductor package, includes: a first redistribution structure comprising at least one first redistribution layer and at least one first insulating layer; a first semiconductor chip electrically connected to the at least one first redistribution layer and disposed on a first surface of the first redistribution structure; a second redistribution structure disposed on a second surface of the first redistribution structure, opposite the first surface of the first redistribution layer, and comprising at least one second redistribution layer and at least one second insulating layer; a first encapsulant between the first and second redistribution structures; an impedance element encapsulated by the first encapsulant; terminal structures connecting the impedance element to the first redistribution structure; first conductive posts electrically connected to the first semiconductor chip, penetrating through the first encapsulant and bypassing the impedance element; and under bump metallurgy (UBM) structures electrically connected to the first conductive posts and disposed on the second redistribution structure, wherein at least a portion of the UBM structures overlap the impedance element in a direction the first redistribution structure and the second redistribution structure oppose each other.

According to an aspect of an example embodiment, a semiconductor package, includes: a first redistribution structure comprising at least one first redistribution layer and at least one first insulating layer; a first semiconductor chip electrically connected to the at least one first redistribution layer and disposed on a first surface of the first redistribution structure; a second semiconductor chip disposed on an upper surface of the first semiconductor chip; a second redistribution structure disposed on a second surface of the first redistribution structure opposite to the first surface of the first redistribution structure and comprising at least one second redistribution layer and at least one second insulating layer; a first encapsulant disposed between the first and second redistribution structures; first conductive posts electrically connected to the first semiconductor chip and penetrating the first encapsulant; and under bump metallurgy (UBM) structures electrically connected to the first conductive posts and disposed in the at least one second insulating layer, wherein the UBM structures comprise: first UBM structures connected by overlapping at least a portion of the first conductive posts in a penetration direction of the first conductive posts; and second UBM structures disposed to not overlap the first conductive posts in a direction in which the first and second redistribution structures oppose each other and surrounded by the first UBM structures, and wherein a two-dimensional arrangement coherence of the second UBM structures is higher than a two-dimensional arrangement coherence of the first UBM structures.

BRIEF DESCRIPTION OF DRAWINGS

The above and other aspects and features will be more apparent from the following description of example embodiments, taken in combination with the accompanying drawings, in which.

DETAILED DESCRIPTION

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1A:
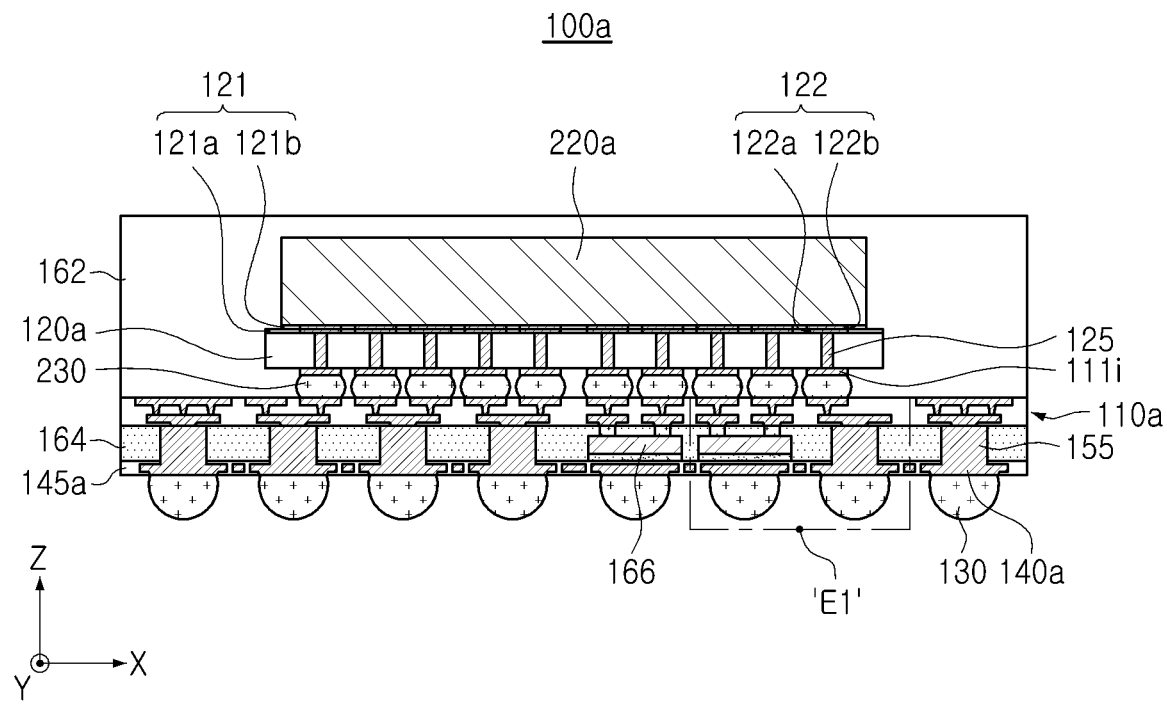
FIGS. 1A and 1B are cross-sectional diagrams illustrating a semiconductor package according to an example embodiment.
Figure 1B:
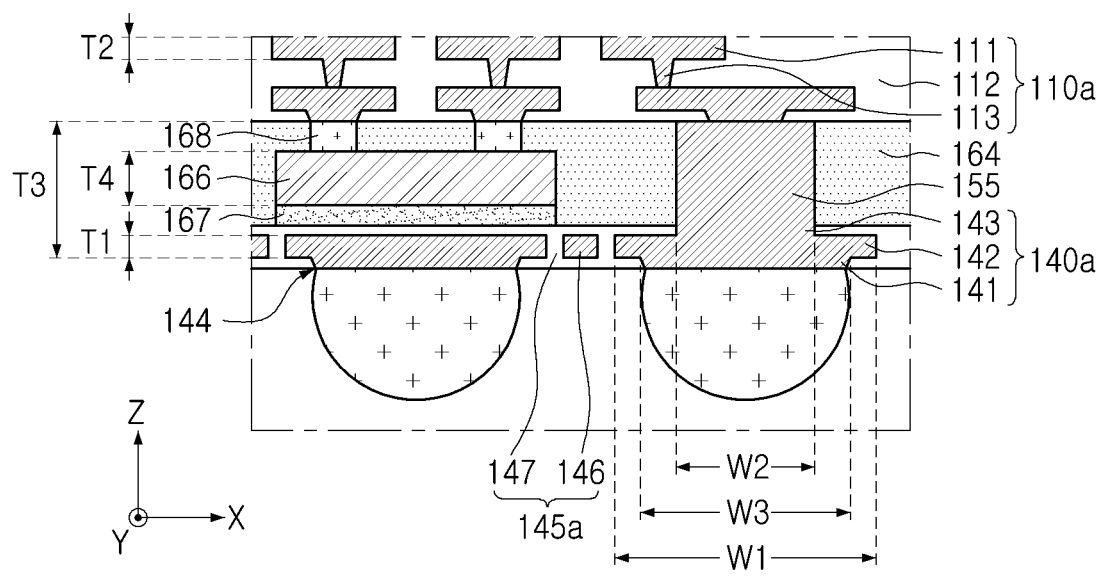

FIG. 1A is a cross-sectional diagram illustrating a semiconductor package according to an example embodiment, and FIG. 1B is an enlarged cross-sectional diagram illustrating region E1 in FIG. 1A.

Referring to FIGS. 1A and 1B, a semiconductor package 100a according to an example embodiment may include a first redistribution structure 110a, a first semiconductor chip 120a, a second semiconductor chip 220a, a first encapsulant 164, first conductive posts 155, and under bump metallurgy (UBM) structures, and the UBM structures may include first UBM structures 140a and/or second UBM structures 144.

FIG. 1A illustrates a fan-out structure in which a portion of the first redistribution structure 110a vertically overlaps the first semiconductor chip 120a and another portion of the first redistribution structure 110a does not vertically overlap the first semiconductor chip 120a, but example embodiments are not limited thereto. The fan-out structure may be extended to a package on package (POP) structure or may be configured as a system in package (SIP) structure.

The first redistribution structure 110a may have a structure in which at least one first redistribution layer 111 and at least one first insulating layer 112 may be alternately stacked. In example embodiment, there may be one or more than one first redistribution layer 111 and one or more than one first insulating layer 112. The first redistribution structure 110a may further include first vias 113 extending from at least one first redistribution layer 111 in a stacking direction (e.g., Z-direction) of the first redistribution structure 110a. The first vias 113 may penetrate through at least one first insulating layer 112.

The at least one first insulating layer 112 may include an insulating material, and may include, for example, a thermosetting resin such as epoxy resin or a thermoplastic resin such as polyimide. For example, at least one first insulating layer 112 may include a photosensitive insulating material such as photoimeagable dielectric (PID) resin. Alternatively or additionally, at least one insulating layer 112 may include a resin mixed with an inorganic filler, for example, Ajinomoto build-up film (ABF). Alternatively or additionally, at least one first insulating layer 112 may include prepreg, flame retardant (FR-4), or bismaleimide triazine (BT). In an example embodiment in which the at least one first insulating layer 112 includes a plurality of first insulating layers 112, the first insulating layers 112 may include the same or different materials, and a boundary between them may not be distinct depending on materials and processes included in each layer.

The first redistribution layers 111 and the first vias 113 may form an electrical path. The first redistribution layers 111 may be disposed in a line shape on an X-Y plane, and the first vias 113 may have a generally or substantially cylindrical shape including inclined side surfaces such that a width thereof may decrease upwardly or downwardly. The first vias 113 may be a filled via structure partially or completely filled with a conductive material, but example embodiments are not limited thereto. For example, the first vias 113 may have a conformal via shape in which a metal material is formed along an inner wall of the via hole.

The first redistribution layers 111 and the first vias 113 may include a conductive material, for example, copper (Cu), aluminum (Al), silver (Ag), tin (Sn), gold (Au), nickel (Ni), lead (Pb), titanium (Ti), or alloys thereof.

The first semiconductor chip 120a may be electrically connected to at least one first redistribution layer 111 and may be disposed on one surface (e.g., an upper surface) of the first redistribution structure 110a. For example, the first and second semiconductor chips 120a and 220a may include a body portion including a semiconductor material such as silicon (Si), germanium (Ge), or gallium arsenide (GaAs) and a device layer or an active layer disposed below the body portion and including an integrated circuit (IC). The first and second semiconductor chips 120a and 220a may include a logic semiconductor chip and/or a memory semiconductor chip. The logic semiconductor chip may be a microprocessor, for example, a central processing unit (CPU), a graphic processing unit (GPU), a field programmable gate array (FPGA), an application processor (AP), a digital signal processor, a cryptographic processor, a controller, or an application specific integrated circuit (ASIC). The memory semiconductor chip may be a volatile memory such as dynamic random access memory (DRAM) or static random access memory (SRAM) or a non-volatile memory such as flash memory.

The first bumps 230 may be disposed and connected between the first semiconductor chip 120a and the first redistribution structure 110a. The first semiconductor chip 120a may be mounted on the upper surface of the first redistribution structure 110a using a flip-chip bonding method, and may include connection pads 111i disposed on the lower surface of the first semiconductor chip 120a. For example, the connection pads 111*i* may include a conductive material such as tungsten (W), aluminum (Al), or copper (Cu), and may be a pad of a bare chip, for example, aluminum (Al) pad, or alternatively, the connection pads 111*i* may be a pad of a packaged chip, for example, a copper (Cu) pad, in example embodiments.

The second semiconductor chip 220*a* may be disposed on a surface (e.g., an upper surface) opposite to a surface (e.g., a lower surface) of the first semiconductor chip 120*a* opposing the first redistribution structure 110*a*. For example, the coupling structure of the first semiconductor chip 120*a* and the second semiconductor chip 220*a* may be SIP, a three-dimensional (3D) integrated circuit structure, the first semiconductor chip 120*a* may be a logic semiconductor chip, and the second semiconductor chip 220*a* may be a memory semiconductor chip.

For example, the first semiconductor chip 120*a* may include a through via 125 electrically connecting the second semiconductor chip 220*a* to at least one first redistribution layer 111. The through-via 125 may be formed of a conductive material, and may include, for example, at least one of tungsten (W), aluminum (Al), and copper (Cu).

For example, the first and second semiconductor chips 120*a* and 220*a* may be connected to each other through connection pads 122. The connection pads 122 may be implemented in the same or a substantially similar manner as the connection pads 111*i*. In example embodiments, the connection pads 122 may couple the first and second semiconductor chips 120*a* and 220*a* to each other through horizontally disposed bumps and may be fully or at least partially surrounded by a non-conductive film layer. The non-conductive film layer may be referred to as an underfill layer, may include a non-conductive polymer, and may include non-conductive paste (NCP). In example embodiments, the non-conductive polymer may be replaced with an intermediate dielectric layer 121.

For example, each of the connection pads 122 may have a structure in which the first connection pad 122*a* and the second connection pad 122*b* may be in contact with each other in a vertical direction, and may be disposed in or buried in the intermediate dielectric layer 121. Accordingly, in an example embodiment, the connection pads 122 may not be exposed. The intermediate dielectric layer 121 may have a structure in which the first intermediate dielectric layer 121*a* in contact with and disposed on the upper surface of the first semiconductor chip 120*a* and the second intermediate dielectric layer 121*b* in contact with and disposed on the lower surface of the second semiconductor chip 220*a* are in contact with each other perpendicularly.

The intermediate dielectric layer 121 may be disposed between the first and second semiconductor chips 120*a* and 220*a* and may be bonded to the first and second semiconductor chips 120*a* and 220*a*, thereby combining the first and second semiconductor chips 120*a* and 220*a* with each other. The intermediate dielectric layer 121 may at least partially or fully surround each of the connection pads 122. The coupling structure of the intermediate dielectric layer 121 and the connection pads 122 may be implemented as hybrid bonding or direct bonding. For example, the intermediate dielectric layer 121 may include at least one of silicon oxide (SiO), silicon nitride (SiN), and silicon carbonitride (SiCN).

For example, before the first semiconductor chip 120*a* and the second semiconductor chip 220*a* are coupled to each other, the first intermediate dielectric layer 121*a* and the first connection pad 122*a* may be disposed on the first semiconductor chip 120*a*, and the second intermediate dielectric layer 121*b* and the second connection pad 122*b* may be disposed on the second semiconductor chip 220*a*. Thereafter, in a high-temperature atmosphere, the first semiconductor chip 120*a* and the second semiconductor chip 220*a* may be vertically coupled to each other.

As compared to a single semiconductor chip, the vertical coupling structure of the first and second semiconductor chips 120*a* and 220*a* may have more device layers and/or active layers. Accordingly, in an example embodiment, an average area per device layer and/or active layer of the first and second semiconductor chips 120*a* and 220*a* may be reduced, the horizontal size of the first and second semiconductor chips 120*a* and 220*a* may be reduced, and overall integration density of the semiconductor package 100*a* may be increased.

In an example embodiment, the number of electrical connection paths with respect to the outside of the vertical coupling structure of the first and second semiconductor chips 120*a* and 220*a* may barely change. Accordingly, the number of electrical connection paths with respect to the outside per unit area of the vertical coupling structure of the first and second semiconductor chips 120*a* and 220*a* may increase.

The electrical connection path with respect to the outside may include first redistribution layers 111, UBM structures, and second bumps 130. For example, the second bumps 130 may have a ball or column shape, and may include solder including tin (Sn) or an alloy (Sn—Ag—Cu) including tin (Sn). Since the second bumps 130 may have a relatively low melting point as compared to other metal materials, the second bumps 130 may be connected to and fixed to the UBM structures of the semiconductor package 100*a* by a thermal compression bonding (TCB) process or a reflow process.

Accordingly, a process in which the second bumps 130 are connected and fixed to the electrical connection path of the semiconductor package 100*a* may generate mechanical or thermodynamic stress in the semiconductor package 100*a*, and the semiconductor package 100*a* may have higher reliability as the semiconductor package 100*a* of example embodiments may be more robust against mechanical or thermodynamic stress. Accordingly, in example embodiments, reliability of at least one of a board level reliability (BLR), a signal integrity (SI) and a power integrity (PI) may be increased.

Since the number of electrical connection paths with respect to the outside per unit area of the vertical coupling structure of the first and second semiconductor chips 120*a* and 220*a* may increase, the concentration of mechanical or thermodynamic stress of the semiconductor package 100*a* may increase. The higher the concentration of the mechanical or thermodynamic stress, the higher the robustness required for UBM structures to maintain shapes thereof or dispositional relationships with adjacent structures may be.

The first encapsulant 164 may be disposed on the other surface (e.g., lower surface) of the first redistribution structure 110*a*. The first conductive posts 155 may be electrically connected to the first semiconductor chip 120*a* and may penetrate through the encapsulant 164. The first UBM structures 140*a* may be disposed on a surface (e.g., a lower surface) opposite to a surface (e.g., an upper surface) of the encapsulant 164 opposing the first redistribution structure 110*a*, may overlap at least a portion of the first conductive posts 155 in a penetration direction (e.g., Z-direction) of the first conductive posts 155 and may be connected to the first conductive posts 155.

Accordingly, since the first UBM structures 140*a*, which are at least a portion of the UBM structures, may distribute a portion of the mechanical or thermodynamic stress received to the first conductive posts 155, robustness of the first UBM structures 140*a* against mechanical or thermodynamic stress may increase.

Also, the penetration length (e.g., 70 μm or more or about 70 μm or more) of the first conductive posts 155 may be formed relatively long due to the nature of the encapsulant 164, and the encapsulant 164 may buffer a portion of the mechanical or thermodynamic stress distributed to the first conductive posts 155 due to the nature of the encapsulant 164.

Also, the relatively long penetration length of the first conductive posts 155 may increase the attenuation efficiency while the mechanical or thermodynamic stress spread to the first redistribution structure 110*a*, such that reliability of the first redistribution structure 110*a* may also be improved.

Accordingly, the semiconductor package 100*a* in an example embodiment may have high integration density or a small size for unit performance due to a vertical coupling structure of the first and second semiconductor chips 120*a* and 220*a*, and may also provide increased reliability.

For example, the second encapsulant 162 may encapsulate and protect the first and second semiconductor chips 120*a* and 220*a*, and may include a molding material such as an epoxy molding compound (EMC). The first encapsulant 164 may also include a molding material. However, in example embodiments, materials included in the first and second encapsulants 164 and 162 are not limited to molding materials, and may include insulating materials which may have protective properties similar to those of molding materials or high ductility. For example, the insulating material may be a thermosetting resin such as epoxy resin or a thermoplastic resin such as polyimide, or may be an insulating material in which inorganic fillers and/or glass fibers are appropriately added to the insulating materials of the first and second insulating layers 112 and 147.

Referring to FIGS. 1A and 1B, a semiconductor package 100*a* according to an example embodiment may include at least one of a second redistribution structure 145*a*, an impedance element 166, an adhesive layer 167, an adhesive layer 167 and terminal structures 168.

The second redistribution structure 145*a* may be disposed on the surface (e.g., lower surface) opposite to the surface (e.g., an upper surface) of the first encapsulant 164 opposing the first redistribution structure 110*a*, a dispositional region for the first and second UBM structures 140*a* and 144, and a structure in which at least one second redistribution layer 146 and at least one second insulating layer 147 are alternately stacked. For example, the at least one second redistribution layer 146 and the at least one second insulating layer 147 may be formed in the same manner in which the at least one first redistribution layer 111 and the at least one first insulating layer 112 are formed.

For example, the first UBM structures 140*a* may be disposed in or buried in at least one second insulating layer 147 and may extend to at least a portion of the first conductive posts 155. Accordingly, the first UBM structures 140*a* may efficiently provide a vertical electrical connection path between the second bumps 130 and the at least one first redistribution layer 111.

For example, each of the first UBM structures 140*a* may be formed by a semi-additive process (SAP), and may include a lower portion 141 of the first UBM layer, an upper portion 142 of the first UBM layer, and an UBM extended portion 143. Accordingly, a maximum width W1 of each of the first UBM structures 140*a* may be greater than a maximum width W2 of each of the first conductive posts 155 and a thickness (greater than T1) of each of the UBM structures 140*a* may be greater than a thickness T2 of each of the at least one first redistribution layer 111, but example embodiments are not limited thereto. The relatively wide width and thick thickness of the first UBM structures 140*a* may stably secure reliability such as BLR, SI, and PI.

In example embodiments, the thickness T1 of the upper portion 142 of the first UBM layer may be greater than the thickness T2 of each of the at least one first redistribution layer 111, and the width W3 of the lower portion 141 of the first UBM layer may be smaller than the width W1 of the upper portion 142 of the first UBM layer and may be wider than the maximum width W2 of each of the first conductive posts 155. For example, a thickness T3 from the upper portion 142 of the first UBM layer to the upper surfaces of the first conductive posts 155 may be 80 μm or more or about 80 μm or more. Thicknesses T1 and T2 and widths W1, W2, and W3 may be measured by analysis using at least one of a micrometer, transmission electron microscopy (TEM), atomic force microscope (AFM), scanning electron microscope (SEM), focused ion beam (FIB) optical microscope and surface profiler.

One of the at least one second redistribution layer 146 may be disposed to two-dimensionally surround the first and second UBM structures 140*a* and 144 either partially or fully. Accordingly, one of the at least one second redistribution layer 146 may prevent crosstalk between the first and second UBM structures 140*a* and 144 or may improve performance of electromagnetic shielding between the upper and lower sides of the second redistribution structure 145*a*.

The number of the at least one first redistribution layer 111 may be greater than the number of the at least one second redistribution layer 146. This may be because, for example, since the first UBM structures 140*a* may be directly connected to a portion of the first conductive posts 155 without being connected to the at least one second redistribution layer 146, a total length of redistribution required in the at least one second redistribution layer 146 may be shorter than that of the at least one first redistribution layer 111. The second UBM structures 144 may be electrically connected to other portions of the first conductive posts 155 through at least one second redistribution layer 146.

The impedance element 166 may be encapsulated by the first encapsulant 164, may be spaced apart from the first conductive posts 155, and may overlap the first semiconductor chip 120*a* in a penetration direction (e.g., a Z-direction) of the first conductive posts 155. For example, the impedance element 166 may be a capacitor component providing capacitance or a coil component providing inductance.

The impedance element 166 may provide impedance (e.g., capacitance) to the first and second semiconductor chips 120*a* and 220*a*, and the first and second semiconductor chips 120*a* and 220*a* may output signals or power based on a combination of a semiconductor circuit and an impedance. As the impedance element 166 is electrically connected to the first and second semiconductor chips 120*a* and 220*a*, the first and second semiconductor chips 120*a* and 220*a* may use the impedance efficiently, such that the signal integrity (SI) of the signal or power integrity (PI) of power may improve.

As compared to a structure in which the impedance element 166 is disposed outside the semiconductor package 100*a*, as the impedance element 166 is disposed in the semiconductor package 100*a*, the first and second semiconductor chips 120*a* and 220*a* may be more closely electrically connected to the impedance element 166. As compared to the structure in which the impedance element 166 is disposed on the lower surface of the second redistribution structure 145a, as the impedance element 166 is encapsulated by the first encapsulant 164, the first and second semiconductor chips 120a and 220a may be more closely electrically connected the impedance element 166.

The impedance element 166 may vertically overlap the first and second semiconductor chips 120a and 220a. Accordingly, in example embodiments, an electrical length between the impedance element 166 and the first and second semiconductor chips 120a and 220a may be decreased.

The terminal structures 168 may be disposed and connected between the impedance element 166 and the first redistribution structure 110a. Accordingly, in example embodiments, an electrical length between the impedance element 166 and the first and second semiconductor chips 120a and 220a may be decreased. For example, the terminal structures 168 may be implemented in the same manner as the first bumps 230 (e.g., solder) or may be implemented as pads.

Since the thickness T4 of the impedance element 166 may be shorter than the penetration length of the first conductive post 155, the adhesive layer 167 may be disposed between the impedance element 166 and the second redistribution structure 145a, and may include an insulating material having adhesiveness or high flexibility.

Figure 1C:
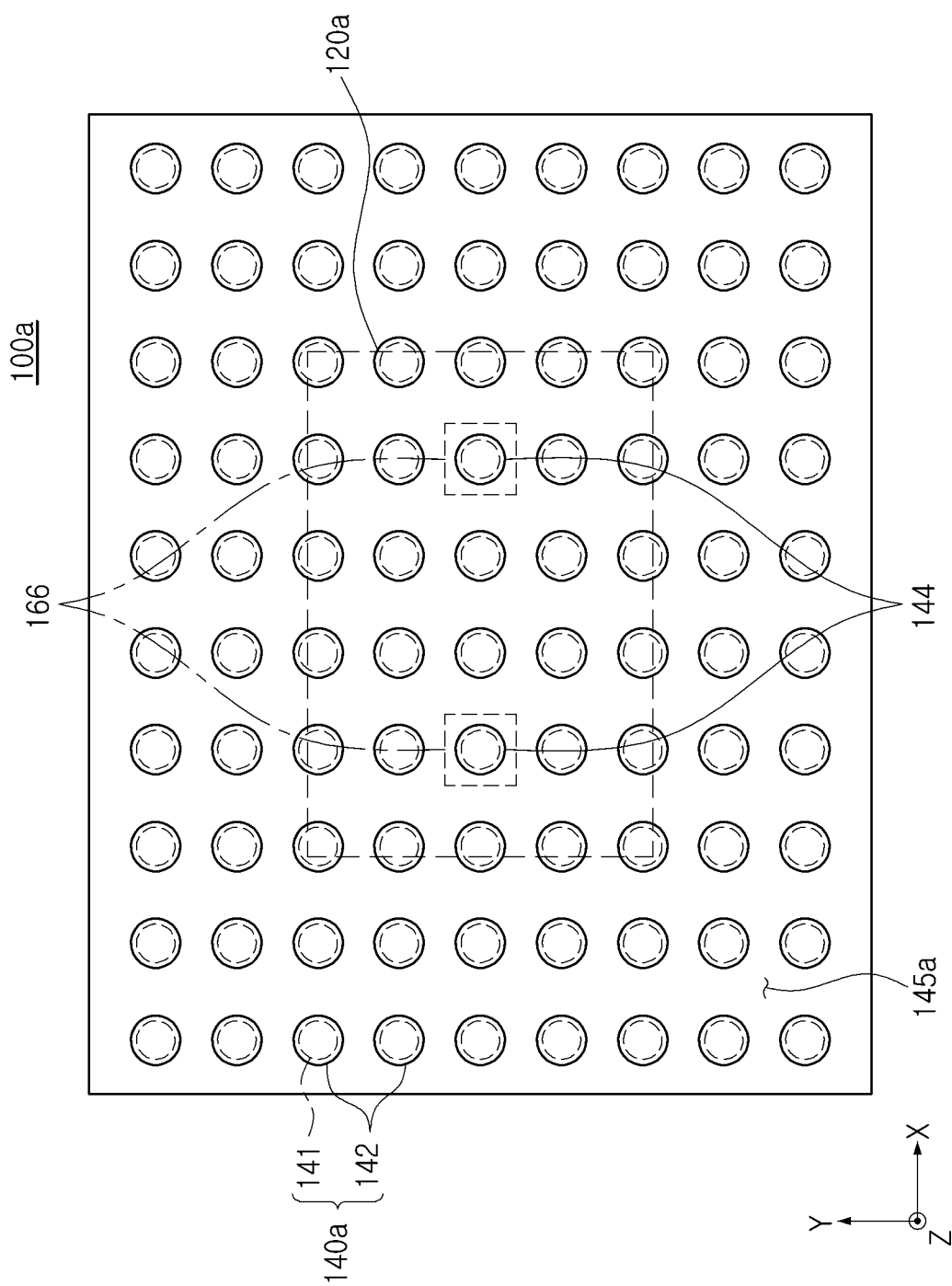
FIGS. 1C and 1D are plan diagrams illustrating a semiconductor package according to an example embodiment.
Figure 1D:
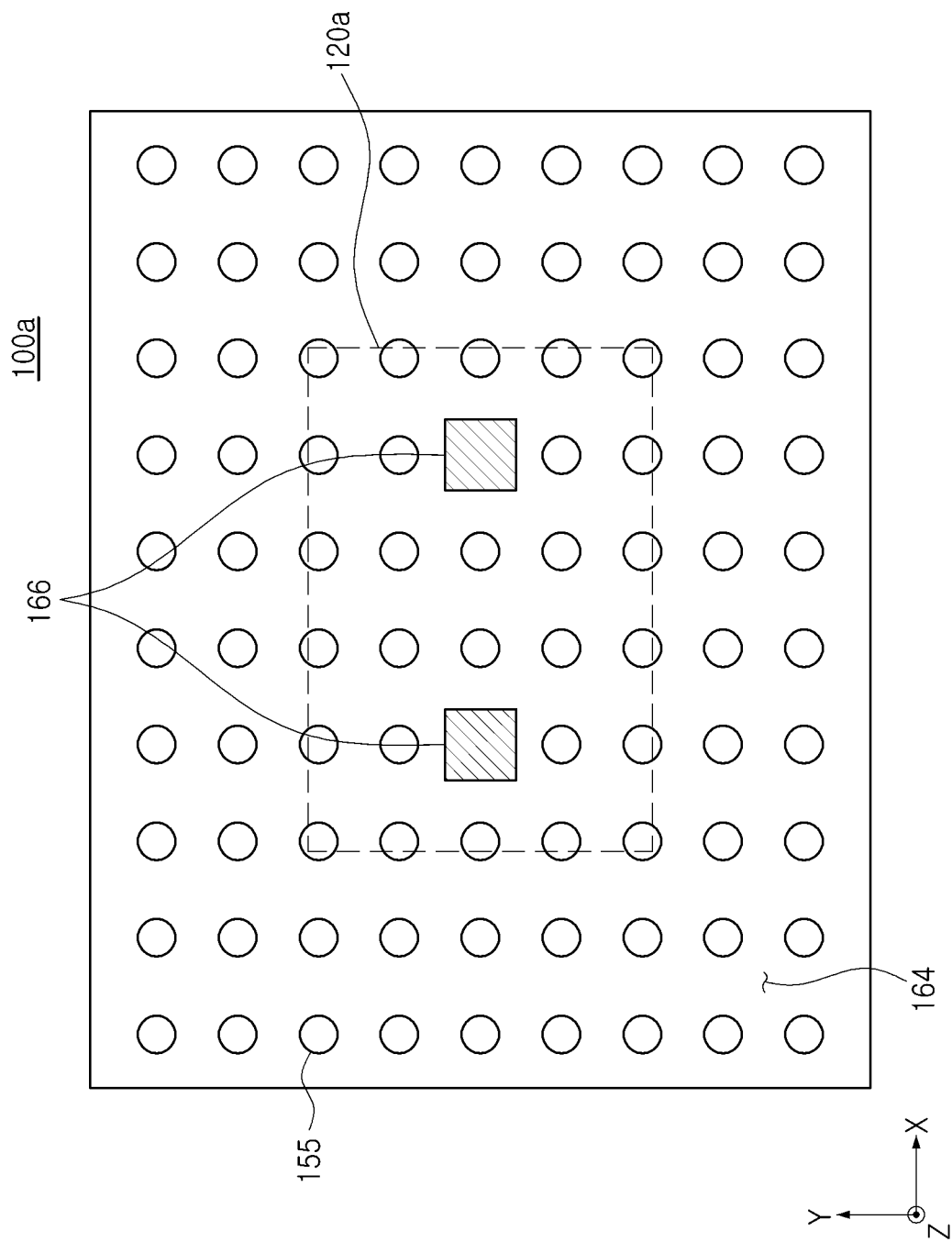

FIGS. 1C and 1D are plan diagrams illustrating a semiconductor package according to an example embodiment.

Referring to FIG. 1C, the first UBM structure 140a and the second UBM structure 144 may be two-dimensionally disposed on the lower surface of the second redistribution structure 145a, and the second UBM structures 144 may be disposed in a position overlapping the impedance element 166.

Referring to FIG. 1D, the first conductive post 155 may be two-dimensionally disposed within the first encapsulant 164 and may be disposed to partially or fully surround the impedance element 166.

Referring to FIGS. 1C and 1D, the first UBM structures 140a may overlap the first conductive posts 155 in a penetration direction (e.g., Z-direction) of the first conductive posts 155 and may be connected to the first conductive posts 155. In an example embodiment, the second UBM structures 144 may not overlap the first conductive posts 155 in a penetration direction (e.g., Z-direction) of the first conductive posts 155 and may overlap the impedance element 166.

The first UBM structures 140a may two-dimensionally surround the second UBM structures 144 partially or fully, and two-dimensional arrangement coherence of the first and second UBM structures 140a and 144 may be higher than two-dimensional arrangement coherence of the first UBM structures 140a.

The two-dimensional arrangement coherence of UBM structures may be defined as a deviation of spacing distances between the UBM structures and the most adjacent UBM structure. Among the first UBM structures 140a, the spacing distance between the first UBM structures 140a most adjacent to the second UBM structures 144 and the adjacent first UBM structures 140a may be longer than the spacing distance with the other first UBM structures 140a. Accordingly, a deviation of spacing distances between the first UBM structures 140a and the adjacent first UBM structures 140a may increase.

As the second UBM structures 144 are added, among the first UBM structures 140a, the spacing distance between the first UBM structures 140a the most adjacent to the second UBM structures 144 and the most adjacent first UBM structures 140a may be almost the same as the spacing distance with the other first UBM structures 140a. Accordingly, the deviation of spacing distance between the first and second UBM structures 140a and 144 and the adjacent UBM structures may decrease, and the two-dimensional arrangement coherence may increase.

As the two-dimensional arrangement coherence increases, a phenomenon in which mechanical/thermodynamic stress applied to the first and second UBM structures 140a and 144 is concentrated at a specific point may be reduced, and accordingly, reliability of the first and second UBM structures 140a and 144 may further improve.

Accordingly, the semiconductor package 100a in an example embodiment may have high integration density or a small size for unit performance due to the vertical coupling structure of the first and second semiconductor chips 120a and 220a, and may also have improved reliability.

Figure 2A:
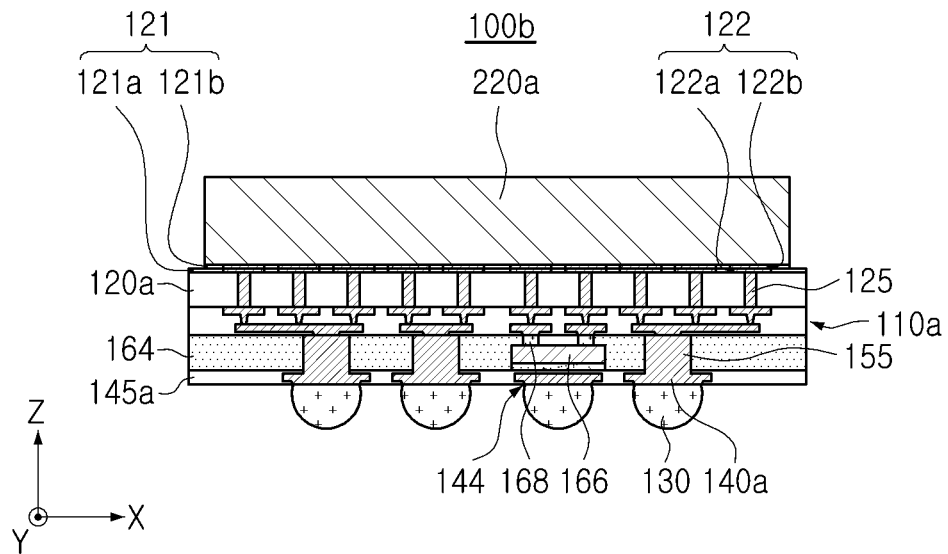
FIG. 2A is a cross-sectional diagram illustrating a simplified structure of a semiconductor package according to an example embodiment.

FIG. 2A is a cross-sectional diagram illustrating a simplified structure of a semiconductor package according to an example embodiment.

Referring to FIG. 2A, a semiconductor package 100b according to an example embodiment may include a first redistribution structure 110a, a first semiconductor chip 120a, a second redistribution structure 145a, a first encapsulant 164, an impedance element 166, terminal structures 168, first conductive posts 155, and under bump metallurgy (UBM) structures, and the UBM structures may include first UBM structures 140a and/or second UBM structures 144.

The first encapsulant 164 may be disposed between the first and second redistribution structures 110a and 145a, and the impedance element 166 may be encapsulated by the first encapsulant 164, the terminal structures 168 may connect the impedance element 166 to the first redistribution structure 110a, the first conductive posts 155 may bypass the impedance element 166 and may penetrate the first encapsulant 164, and the UBM structures may be electrically connected to the first conductive posts 155 and may be disposed on the second redistribution structure 145a.

Since the impedance element 166 may be electrically connected and more adjacent to the first semiconductor chip 120a as compared to a structure in which the impedance element 166 is disposed on the lower surface of the second redistribution structure 145a, signal integrity (SI) or a signal or power integrity (PI) of power may be improved. Due to the absence of a region in which the impedance element 166 is disposed on the lower surface of the second redistribution structure 145a, the two-dimensional arrangement coherence of the first UBM structures 140a may decrease.

The second UBM structures 144 may be disposed such that the first and second redistribution structures 110a and 145a may overlap the impedance element 166 in a direction (e.g., Z-direction) in which the first and second redistribution structures 110a and 145a oppose each other, two-dimensional arrangement coherence of UBM structures may be increased. Accordingly, the phenomenon in which mechanical/thermodynamic stress applied to the UBM structures is concentrated at a specific point may be reduced, reliability of the first and second UBM structures 140a and 144 may be further improved.

Also, the first encapsulant 164 may be relatively less affected by changes in the overall volume of the impedance element 166, and the volume of the first encapsulant 164 may be barely affected by the volume of the impedance element 166. Accordingly, the semiconductor package 100b of example embodiments may have a structure advantageous in terms of high integration density or reduction in size for performance.

Accordingly, the semiconductor package 100b in an example embodiment may have a structure advantageous in increasing integration density or reducing the size for performance depending on the position of the impedance element 166, and also improving reliability.

FIG. 2A illustrates a fan-in structure in which the redistribution structure 110a and the semiconductor chip 120a completely overlap each other vertically, and accordingly, in an example embodiment, the semiconductor package 100b may have a fan-out structure and also a fan-in structure in FIG. 1A.

Figure 2B:
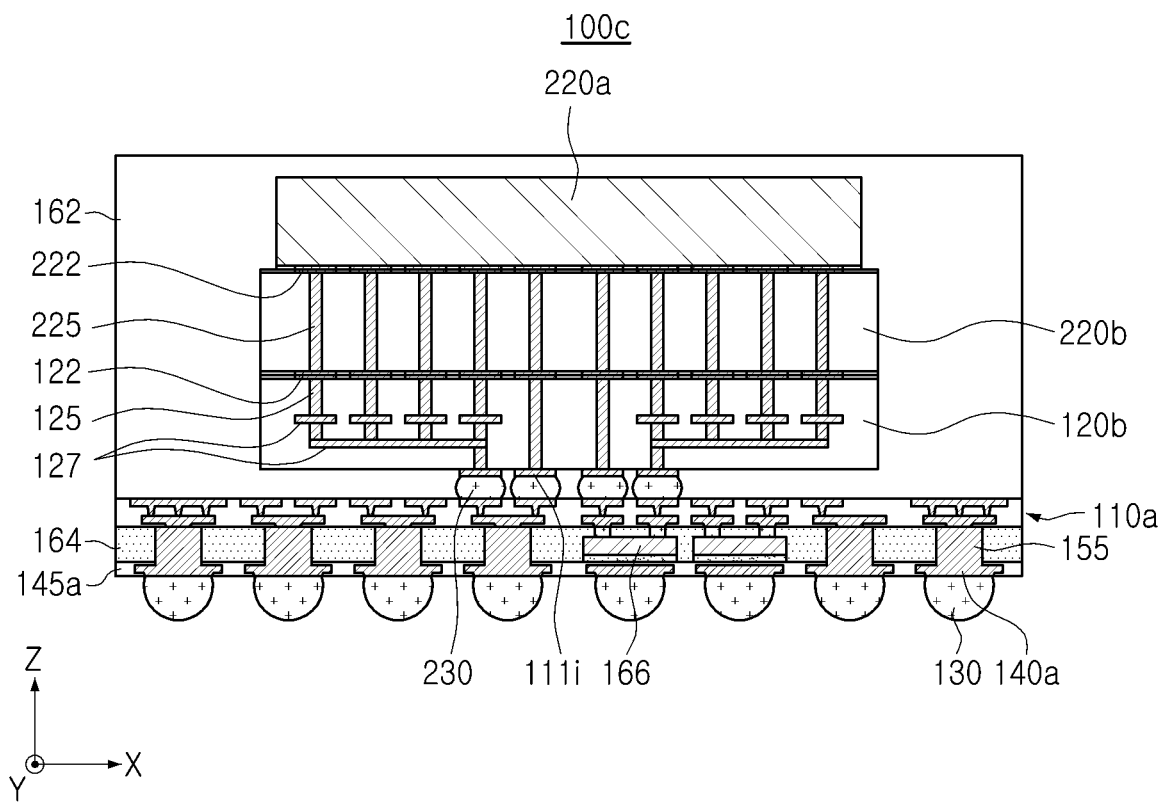
FIG. 2B is a cross-sectional diagram illustrating a structure in which a semiconductor package includes a greater number of semiconductor chips according to an example embodiment.

FIG. 2B is a cross-sectional diagram illustrating a structure in which a semiconductor package may include a greater number of semiconductor chips according to an example embodiment.

Referring to FIG. 2B, the number of second semiconductor chips 220a and 220b of the semiconductor package 100c in an example embodiment may be greater than the example in FIG. 1A in which the number of semiconductor chip is one. In example embodiments, the total number of first and second semiconductor chips 120b, 220b, and 220a may be greater than three.

For example, the first semiconductor chip 120b may include a lower region on which the device layers 127 are disposed and an upper region in which through vias 125 are disposed. The device layers 127 may include devices such as transistors and/or memory cells, and an upper region may include a semiconductor material such as silicon (Si).

For example, among the second semiconductor chips 220a and 220b, the second semiconductor chips 220b disposed more adjacent to the first semiconductor chip 120b may include through-vias 225, and the through-vias 225 may be implemented in the same manner as the through vias 125.

The connection pads 222 may be vertically connected between the second semiconductor chips 220a and 220b. For example, the connection pads 222 may be implemented in the same or a substantially similar manner (e.g., hybrid bonding or direct bonding) as the connection pads 122, and may be blocked by an intermediate dielectric layer so as not to be exposed to the second encapsulant 162.

Figure 2C:
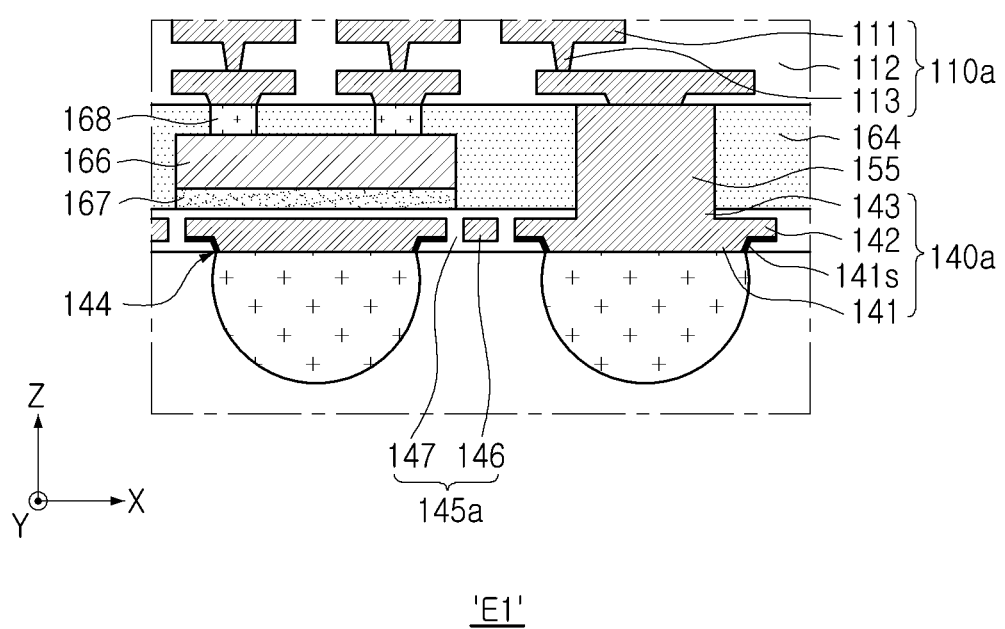
FIG. 2C is a cross-sectional diagram illustrating first and second UBM layers of UBM structures of a semiconductor package according to an example embodiment.

FIG. 2C is a cross-sectional diagram illustrating first and second UBM layers of UBM structures of a semiconductor package according to an example embodiment.

Referring to FIG. 2C, each of the first and second UBM structures 140a and 144 may include a first UBM layer 141+142 and a second UBM layer 141s. The first UBM layer may include a lower portion 141 and an upper portion 142 so that the lower portion 141 and the upper portion 142 together are included in the first UBM layer 141+142.

The first UBM layer 141+142 may be partially or fully surrounded by at least one second insulating layer 147, and the second UBM layer 141s may be disposed between at least one second insulating layer 147 and the first UBM layer 141+142 and may include a material (e.g., titanium, organic material) different from a metal material (e.g., copper) of the first UBM layer 141+142. Accordingly, minute gaps (or interfacial separation) between each of the first and second UBM structures 140a and 144 and the at least one second insulating layer 147 may be prevented. Since the micro-gaps may be a factor reducing reliability, reliability of the first and second UBM structures 140a and 144 in which the micro-gaps are prevented may be improved.

For example, the second UBM layer 141s may be formed by sputtering as a seed layer for the first UBM layer 141+142, and may include an organic material such as an adhesive polymer for increasing adhesion to the first UBM layer 141+142.

Figure 3A:
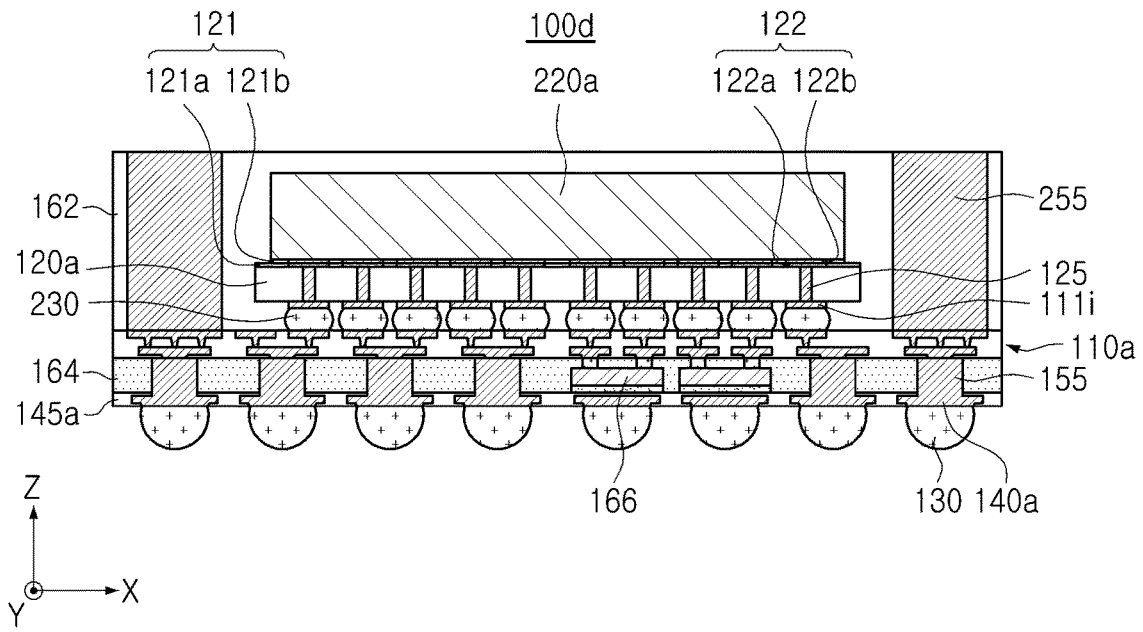
FIGS. 3A to 3C are cross-sectional diagrams illustrating a further expanded structure based on a second encapsulant and a second conductive post of a semiconductor package according to an example embodiment.
Figure 3B:
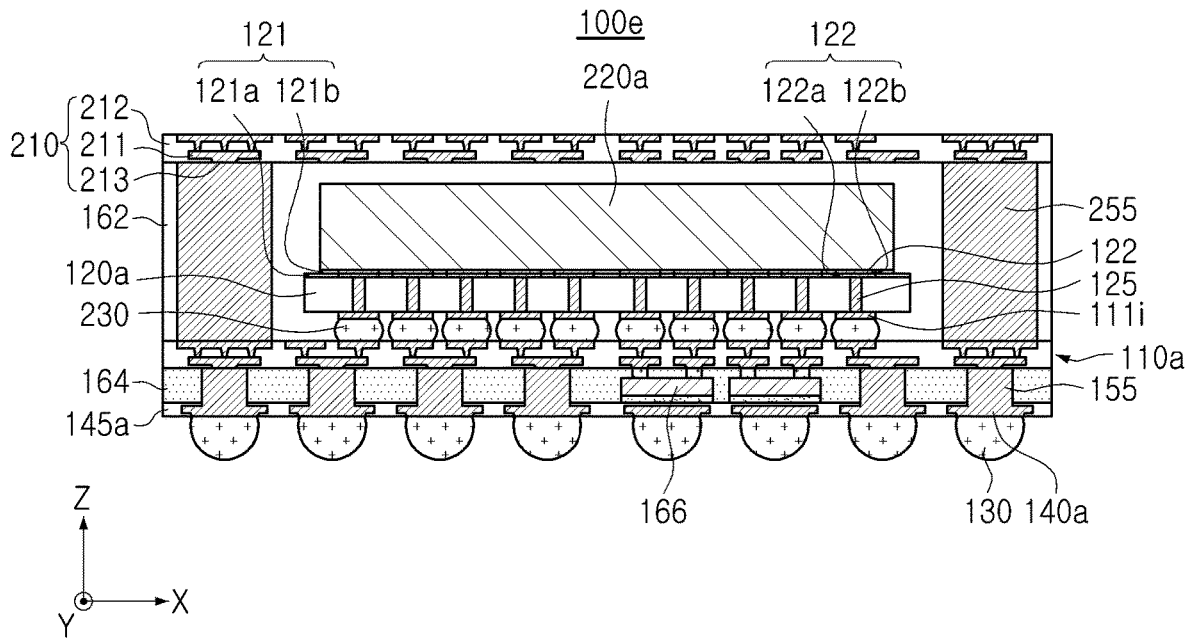
Figure 3C:
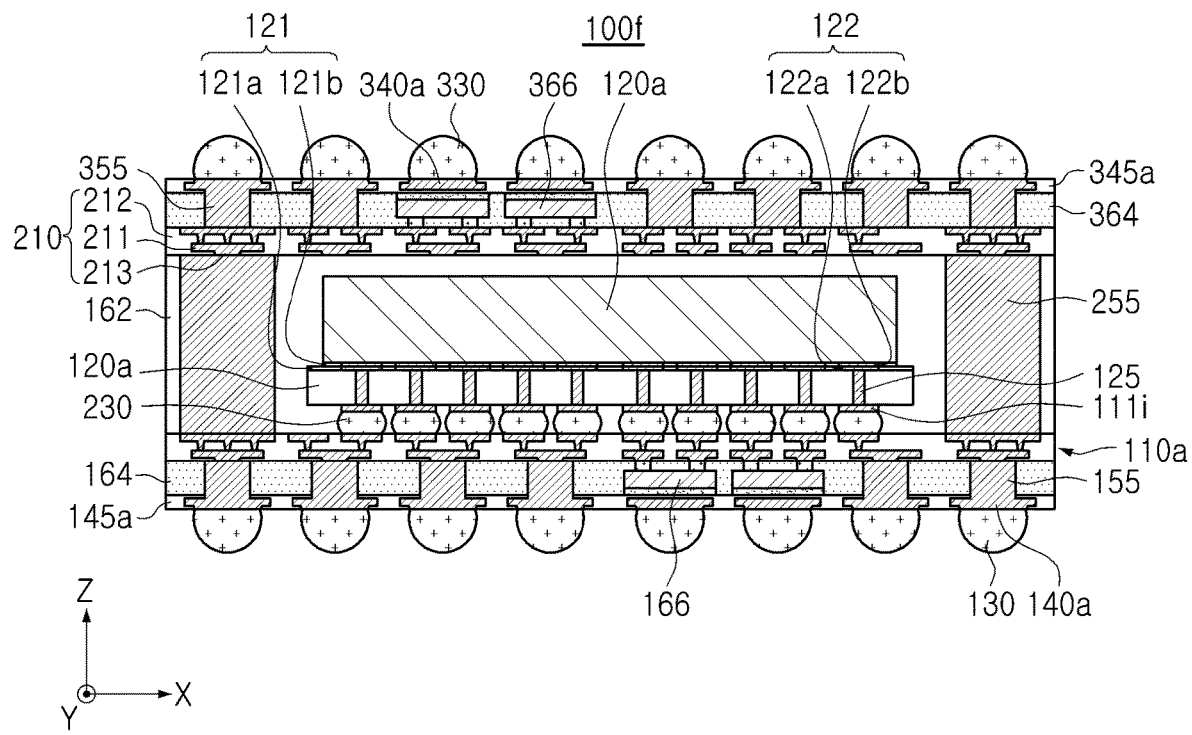

FIGS. 3A to 3C are cross-sectional diagrams illustrating a further expanded structure based on a second encapsulant and a second conductive post of a semiconductor package according to an example embodiment.

Referring to FIGS. 3A to 3C, the semiconductor packages 100d, 100e, and 100f in an example embodiment may further include a second conductive post 255 penetrating the second encapsulant 162. The second conductive post 255 may be formed in the same manner as the first conductive post 155.

Referring to FIGS. 3B and 3C, the semiconductor packages 100e and 100f in an example embodiment may include a third redistribution structure 210 disposed on an upper surface of a second encapsulant 162, the third redistribution structure 210 may have a structure in which at least one third redistribution layer 211 and at least one third insulating layer 212 are alternately stacked, and may include third vias 213 vertically connected to at least one third insulating layer 212, and may be implemented in the same manner as the first redistribution structure 110a.

Referring to FIG. 3C, the semiconductor package 100f according to an example embodiment may further include a fourth redistribution structure 345a, which may be implemented in the same manner as the second redistribution structure 145a, a third encapsulant 364, which may be implemented in the same manner as the first encapsulant 164, an additional impedance element 366, which may be implemented in the same manner as the impedance element 166, third conductive posts 355, which may be implemented in the same manner as the first conductive posts 155, additional UBM structures 340a which may be implemented in the same manner as the second bumps 130, and at least one of the third bumps 330 which may be implemented in this manner as the second bumps 130.

Figure 3D:
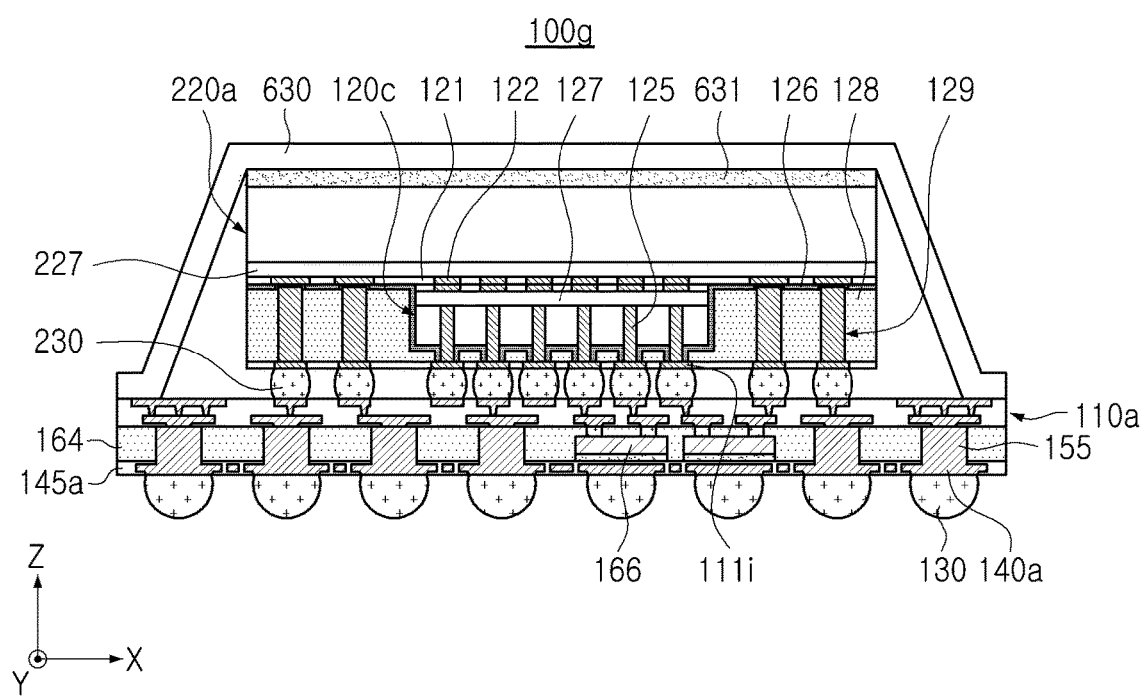
FIG. 3D is a cross-sectional diagram illustrating a structure in which semiconductor chips of a semiconductor package are more closely coupled according to an example embodiment.

FIG. 3D is a cross-sectional diagram illustrating a structure in which semiconductor chips of a semiconductor package are more closely coupled according to an example embodiment.

Referring to FIG. 3D, a semiconductor package 100g in an example embodiment may include at least one of an intermediate dielectric layer 121, a first dielectric layer 126, a second dielectric layer 128, bypass through-vias 129, a heat dissipation structure 630 and an adhesive member 631.

The first semiconductor chip 120c may be disposed on one surface of the first redistribution structure 110a, and the second semiconductor chip 220a may be disposed on the first redistribution structure 110a may be disposed on a surface (e.g., upper surface) opposite to the surface (e.g., lower surface) opposing the first redistribution structure 110a. The first and second semiconductor chips 120c and 220a may include device layers 127 and 227, respectively, portions of the first and second semiconductor chips 120c and 220a other than the device layers 127 and 227 may include a semiconductor material such as silicon (Si), and may support the device layers 127 and 227. In the first and second semiconductor chips 120c and 220a, relationships between the device layers 127 and 227 and portions other than the device layers 127 and 227 may vary in example embodiments.

The intermediate dielectric layer 121 may be disposed between the first and second semiconductor chips 120c and 220a and may be bonded to the first and second semiconductor chips 120c and 220a, thereby bonding the first and second semiconductor chips 120c and 220a. 220a to each other. The intermediate dielectric layer 121 may surround each of the connection pads 122. The combined structure of the intermediate dielectric layer 121 and the connection pads 122 may be implemented as hybrid bonding or direct bonding. For example, the intermediate dielectric layer 121 may include at least one of silicon oxide (SiO), silicon nitride (SiN), and silicon carbonitride (SiCN).

For example, the number of intermediate dielectric layers 121 may be one or more, and the intermediate dielectric layers 121 may be vertically stacked. For example, a lower portion of the intermediate dielectric layers 121 may be bonded to the first semiconductor chip 120c and an upper portion of the intermediate dielectric layers 121 may be bonded to the second semiconductor chip 220a.

The horizontal size of the first semiconductor chip 120c may be smaller than the horizontal size of the second semiconductor chip 220a, and the horizontal sizes of upper and lower portions of the intermediate dielectric layers 121 may be different from each other.

The first dielectric layer 126 may be disposed on the lower surface and the side surface of the first semiconductor chip 120c, may be disposed on an edge region of the lower surface of the second semiconductor chip 220a, and may partially of fully surround the lower portion of each of the through vias 125. For example, the first dielectric layer 126 may include at least one of silicon oxide (SiO), silicon nitride (SiN), and silicon carbonitride (SiCN).

The second dielectric layer 128 may partially or fully surround the first semiconductor chip 120c by encapsulating the first semiconductor chip 120c. For example, since the horizontal size of the coupling structure of the second dielectric layer 128 and the first semiconductor chip 120c may be substantially the same as that of the second semiconductor chip 220a, a combination structure of the first and second semiconductor chips 120c and 220a and the second dielectric layer 128 may have a shape similar to a rectangular parallelepiped. For example, the second dielectric layer 128 may include the same material as the molding material (e.g., EMC) of the first encapsulant 164 or an insulating material having characteristics similar to those of the molding material.

For example, the lower surface of the second dielectric layer 128 may be planarized by a planarization process such as a grinding process or a polishing process, and the second dielectric layer 128 may protect the bypass through-vias 129 and through-vias 125 from the planarization process, and loads of the bypass through-vias 129 and through-vias 125 may be shared to support the first and second semiconductor chips 120c and 220a.

Each of the bypass through-vias 129 may penetrate through the second dielectric layer 128, may bypass the first semiconductor chip 120c and may electrically connect the second semiconductor chip 220a to a portion of the first bumps 230. For example, the bypass through-vias 129 may include the same material as that of the first conductive post 155, may be formed in the same manner as the first conductive post 155, and may have a horizontal diameter greater than the horizontal diameter of the through-vias 125.

The heat dissipation structure 630 may be disposed on the upper surface of the first redistribution structure 110a and may accommodate the first and second semiconductor chips 120c and 220a. For example, the heat dissipation structure 630 may include a conductive material having excellent thermal conductivity (e.g., gold (Au), silver (Ag), copper (Cu), iron (Fe), graphite, graphene). FIG. 3D illustrates a cap shape of the heat dissipation structure 630, but example embodiments are not limited thereto.

For example, an edge portion of the heat dissipation structure 630 may be adhered to the first redistribution structure 110a by an adhesive, and a central portion of the heat dissipation structure 630 may be adhered to the second semiconductor chip 220a by an adhesive member 631. For example, the adhesive and the adhesive member 631 may include a thermally conductive adhesive tape, thermally conductive grease, or thermally conductive adhesive.

FIGS. 4A to 4H are cross-sectional diagrams illustrating a method of manufacturing a semiconductor package according to an example embodiment.

Figure 4A:
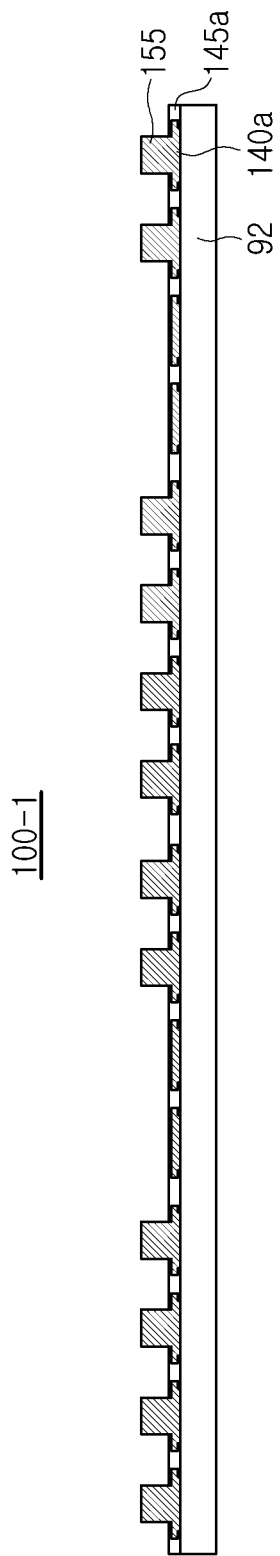
FIGS. 4A to 4H are cross-sectional diagrams illustrating a method of manufacturing a semiconductor package according to an example embodiment.

Referring to FIG. 4A, a first process 100-1 of the method of manufacturing a semiconductor package in an example embodiment may include forming a second redistribution structure 145a and a first conductive post 155 on an upper surface of a carrier substrate 92. For example, the first UBM structures 140a in FIG. 4A may be in an unfinished state.

For example, the first conductive posts 155 may be formed by, in a state in which a structure including a material for exposure and development such as photoresist is formed, forming a hole formed by removing a portion of the structure and plating to fill the hole. Thereafter, the photoresist may be removed. This method according to an example embodiment may be advantageous in increasing or adjusting the penetration length of the first conductive posts 155.

Figure 4B:
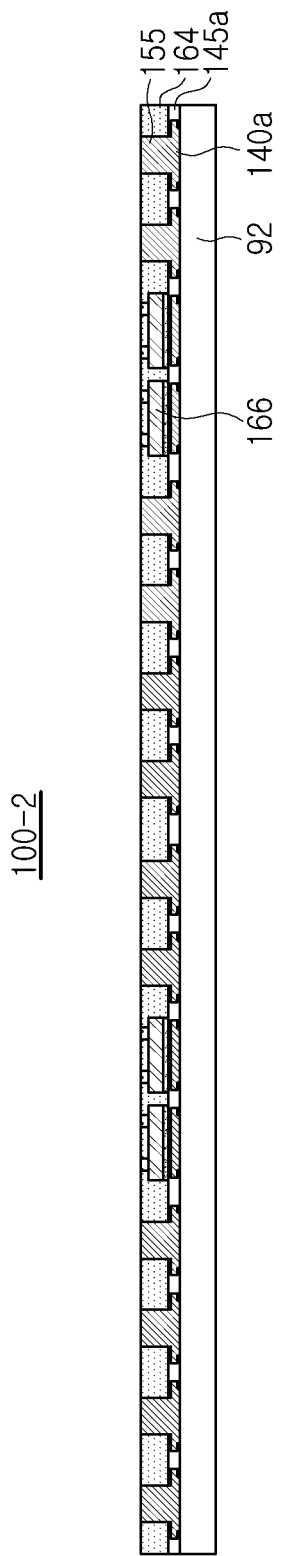

Referring to FIG. 4B, a second process 100-2 of the method of manufacturing a semiconductor package in an example embodiment may include disposing the impedance element 166, and filling a first encapsulant 164 in a space not occupied by the impedance element 166 and the first conductive post 155 on the upper side of the second redistribution structure 145a.

Figure 4C:
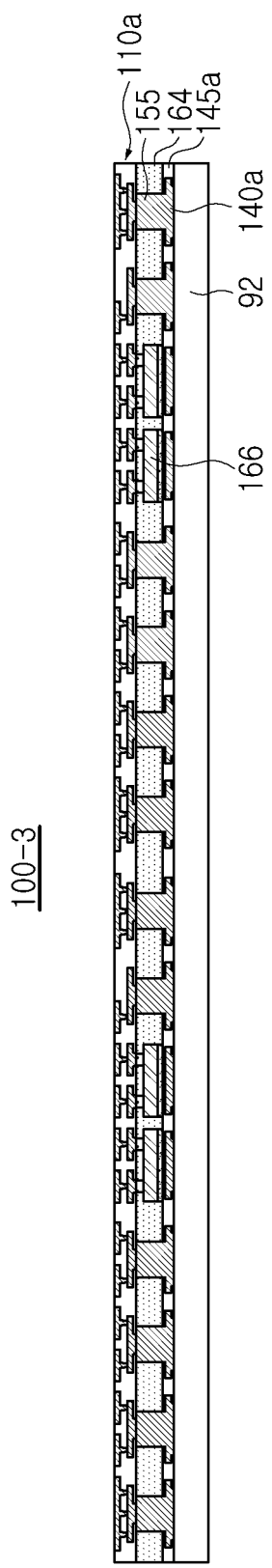

Referring to FIG. 4C, a third process 100-3 of the method of manufacturing a semiconductor package in an example embodiment may include forming the first redistribution structure 110a on the upper surface of the first encapsulant 164.

Figure 4D:
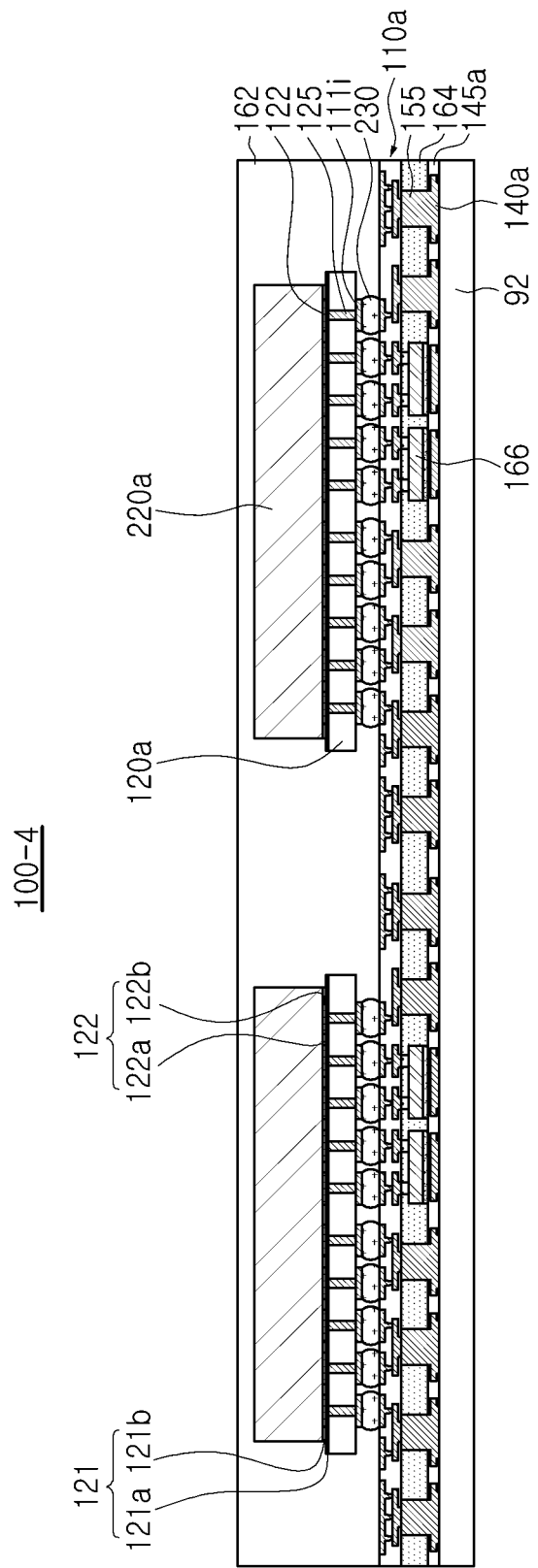

Referring to FIG. 4D, a fourth process 100-4 of the method of manufacturing a semiconductor package in an example embodiment may include mounting a structure in which the first and second semiconductor chips 120a and 220a are vertically coupled to the first redistribution structure 110a using the first bumps 230, and filling a second encapsulant 162 in a space not occupied by the first and second semiconductor chips 120a and 220a on the upper side of the first redistribution structure 110a.

Figure 4E:
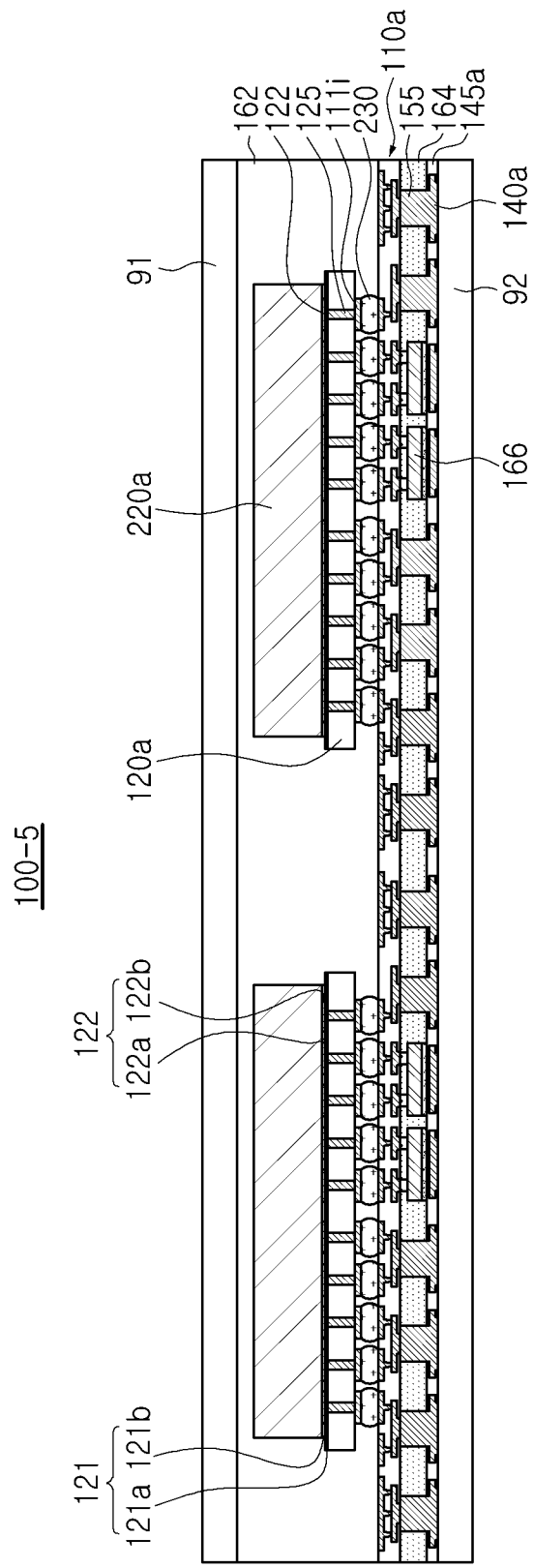

Referring to FIG. 4E, a fifth process 100-5 of the method for manufacturing a semiconductor package in an example embodiment may include disposing a carrier substrate 91 on the upper surface of the second encapsulant 162.

Figure 4F:
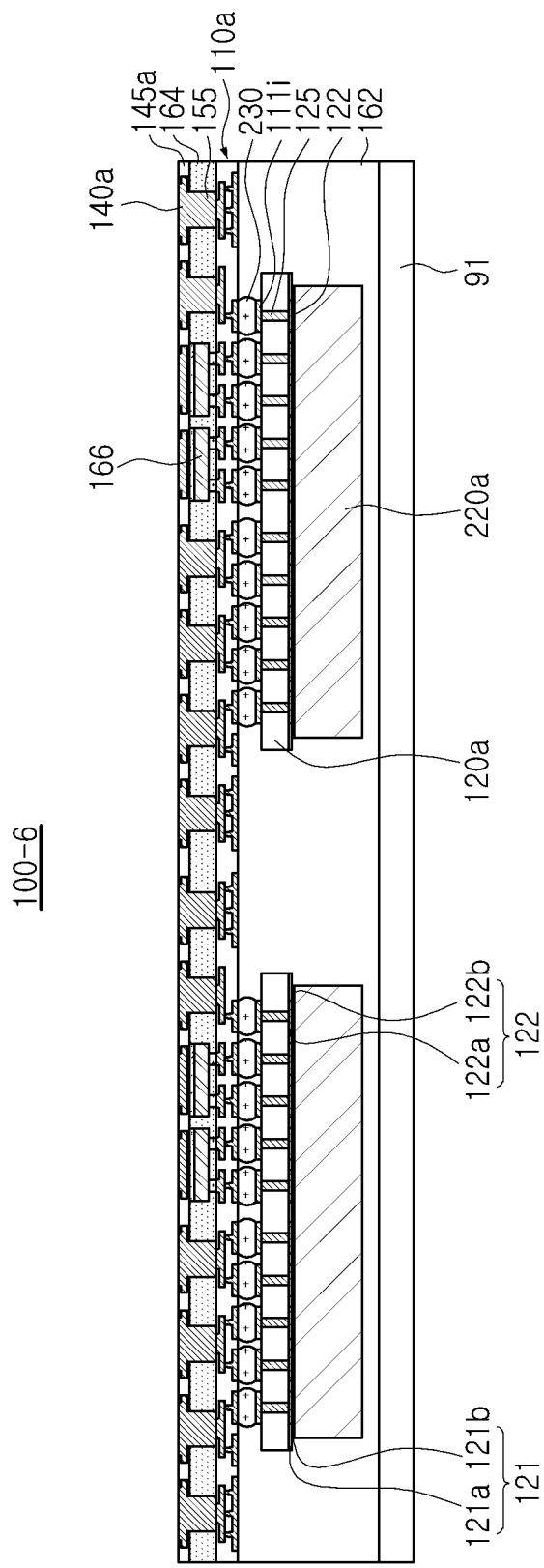

Referring to FIGS. 4E and 4F, a sixth process 100-6 of the method of manufacturing a semiconductor package in an example embodiment may include separating the carrier substrate 92 from the second redistribution structure 145a. For example, the first UBM structures 140a may be completed by additional processing (e.g., additional plating, partial etching, surface treatment) in the sixth process 100-6.

Figure 4G:
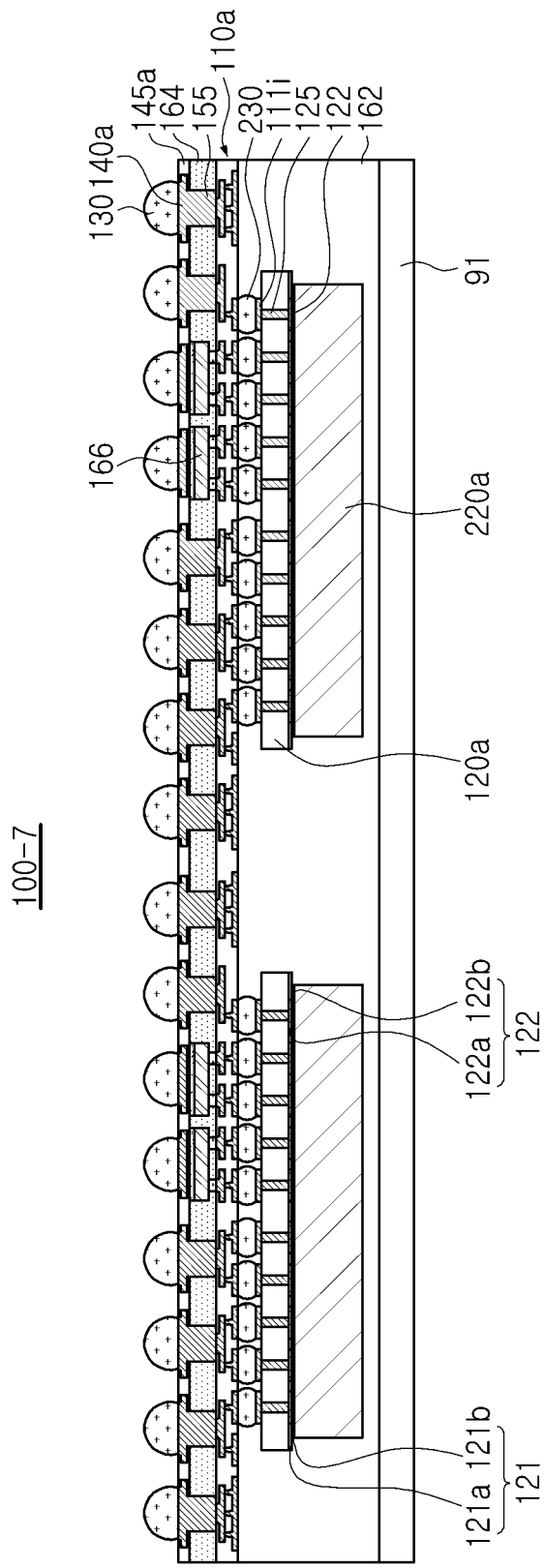

Referring to FIG. 4G, in a seventh process 100-7 of the method of manufacturing a semiconductor package in an example embodiment may include forming second bumps 130 on the first UBM structures 140a of the second redistribution structure 145a.

Figure 4H:
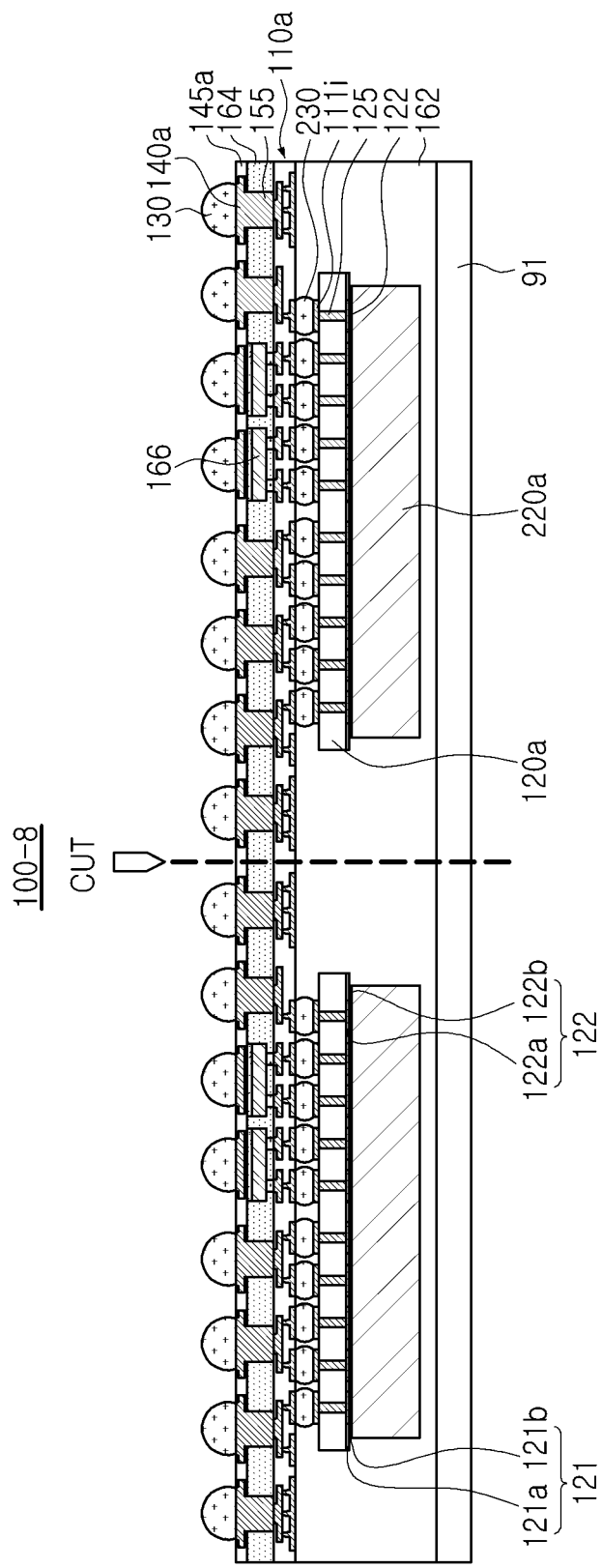

Referring to FIG. 4H, an eighth process 100-8 of the method of manufacturing a semiconductor package in an example embodiment may include vertically cutting (CUT)

the semiconductor package. Accordingly, a plurality of semiconductor packages may be manufactured simultaneously. Thereafter, the carrier substrate 91 may be separated from the plurality of semiconductor packages. The method of manufacturing the semiconductor package 100a in FIG. 1A is not limited to the method of manufacturing the semiconductor package in FIGS. 4A to 4H.

According to the aforementioned example embodiments, a structure advantageous in increasing integration density of the semiconductor package or reducing the size for unit performance may be obtained, and reliability (or reliability for the unit price/size) may be secured.

While aspects of example embodiments have been particularly shown and described, it will be understood that various changes in form and details may be made therein without departing from the spirit and scope of the following claims.

What is claimed is:

1. A semiconductor package, comprising:
    a first redistribution structure comprising at least one first redistribution layer and at least one first insulating layer;
    a first semiconductor chip electrically connected to the at least one first redistribution layer and disposed on a first surface of the first redistribution structure;
    a second semiconductor chip on an upper surface of the first semiconductor chip;
    a first encapsulant on a second surface of the first redistribution structure opposite the first surface of the first redistribution layer;
    first conductive posts electrically connected to the first semiconductor chip and penetrating the first encapsulant; and
    under bump metallurgy (UBM) structures on a lower surface of the first encapsulant,
    wherein at least a portion of the UBM structures overlap at least a portion of the first conductive posts in a penetration direction of the first conductive posts, and are connected to the first conductive posts.

2. The semiconductor package of claim 1, further comprising:
    first bumps, between the first semiconductor chip and the first redistribution structure, connecting the first semiconductor chip to first redistribution structure,
    wherein the first semiconductor chip comprises a through via electrically connecting the second semiconductor chip to the at least one first redistribution layer.

3. The semiconductor package of claim 1, further comprising:
    an impedance element encapsulated by the first encapsulant, spaced apart from the first conductive posts, and overlapping the first semiconductor chip in a penetration direction of the first conductive posts; and
    terminal structures, between the impedance element and the first redistribution structure, connecting the impedance element to the first redistribution structure.

4. The semiconductor package of claim 1,
    wherein a maximum width of each of the UBM structures is greater than a maximum width of each of the first conductive posts, and
    wherein a thickness of each of the UBM structures is greater than a thickness of each of the at least one first redistribution layer.

5. The semiconductor package of claim 1, further comprising:
    a second encapsulant encapsulating the first semiconductor chip; and
    a second conductive post penetrating the second encapsulant.

6. The semiconductor package of claim 1, further comprising:
    a second redistribution structure, on a lower surface of the first encapsulant, providing a dispositional region for the UBM structures, and comprising at least one second redistribution layer and at least one second insulating layer.

7. The semiconductor package of claim 6, wherein at least a portion of the UBM structures is in the at least one second insulating layer, and extend to at least a portion of the first conductive posts.

8. The semiconductor package of claim 6,
    wherein one of the at least one second redistribution layer is disposed around the UBM structures, and
    wherein a number of the at least one first redistribution layer is greater than a number of the at least one second redistribution layer.

9. The semiconductor package of claim 6, wherein each of the UBM structures comprises:
    a first UBM layer surrounded by the at least one second insulating layer; and
    a second UBM layer, between the at least one second insulating layer and the first UBM layer, comprising a material different from a metal material of the first UBM layer.

10. The semiconductor package of claim 6, wherein the UBM structures comprise:
    first UBM structures overlapping a portion of the first conductive posts in a penetration direction of the first conductive posts, and connected to the first conductive posts; and
    second UBM structures, not overlapping the first conductive posts in a direction in which the first redistribution structure and the second redistribution structure oppose each other.

11. The semiconductor package of claim 10, wherein a two-dimensional arrangement coherence of the second UBM structures is higher than a two-dimensional arrangement coherence of the first UBM structures.

12. A semiconductor package, comprising:
    a first redistribution structure comprising at least one first redistribution layer and at least one first insulating layer;
    a first semiconductor chip electrically connected to the at least one first redistribution layer and disposed on a first surface of the first redistribution structure;
    a second redistribution structure, on a second surface of the first redistribution structure, opposite the first surface of the first redistribution layer, and comprising at least one second redistribution layer and at least one second insulating layer;
    a first encapsulant between the first and second redistribution structures;
    an impedance element encapsulated by the first encapsulant;
    terminal structures connecting the impedance element to the first redistribution structure;
    first conductive posts electrically connected to the first semiconductor chip, penetrating through the first encapsulant and bypassing the impedance element; and
    under bump metallurgy (UBM) structures electrically connected to the first conductive posts and disposed on the second redistribution structure,
    wherein at least a portion of the UBM structures overlap the impedance element in a direction in which the first redistribution structure and the second redistribution structure oppose each other.

13. The semiconductor package of claim 12, further comprising:
a second semiconductor chip on an upper surface opposite the first semiconductor chip;
wherein the first semiconductor chip comprises a through via electrically connecting the second semiconductor chip to the at least one first redistribution layer.

14. The semiconductor package of claim 13,
wherein a maximum width of each of the UBM structures is greater than a maximum width of each of the first conductive posts, and
wherein a thickness of each of the UBM structures is greater than a thickness of each of the at least one first redistribution layer.

15. The semiconductor package of claim 14,
wherein the impedance element comprises a capacitor overlapping the first semiconductor chip in a penetration direction of the first conductive posts, and
wherein the UBM structures comprises:
first UBM structures overlapping a portion of the first conductive posts in a penetration direction of the first conductive posts and connected to the first conductive posts; and
second UBM structures overlapping the impedance element in a direction in which the first redistribution structure and the second redistribution structure oppose each other.

16. The semiconductor package of claim 15,
wherein the first UBM structures are disposed in the at least one second insulating layer and extend to at least a portion of the first conductive posts, and
wherein the second UBM structures are disposed in the at least one second insulating layer.

17. The semiconductor package of claim 16,
wherein a number of the at least one first redistribution layer is greater than a number of the at least one second redistribution layer, and
wherein one of the at least one second redistribution layer is around the UBM structures.

18. The semiconductor package of claim 17, wherein each of the UBM structures comprises:
a first UBM layer surrounded by the at least one second insulating layer; and
a second UBM layer, between the at least one second insulating layer and the first UBM layer, comprising a material different from a metal material of the first UBM layer.

19. A semiconductor package, comprising:
a first redistribution structure comprising at least one first redistribution layer and at least one first insulating layer;
a first semiconductor chip electrically connected to the at least one first redistribution layer, and disposed on a first surface of the first redistribution structure;
a second semiconductor chip on an upper surface of the first semiconductor chip;
a second redistribution structure, on a second surface of the first redistribution structure opposite to the first surface of the first redistribution structure, comprising at least one second redistribution layer and at least one second insulating layer;
a first encapsulant disposed between the first and second redistribution structures;
first conductive posts electrically connected to the first semiconductor chip and penetrating the first encapsulant; and
under bump metallurgy (UBM) structures electrically connected to the first conductive posts and disposed in the at least one second insulating layer,
wherein the UBM structures comprise:
first UBM structures connected by overlapping at least a portion of the first conductive posts in a penetration direction of the first conductive posts; and
second UBM structures not overlapping the first conductive posts in a direction in which the first and second redistribution structures oppose each other, and surrounded by the first UBM structures, and
wherein a two-dimensional arrangement coherence of the second UBM structures is higher than a two-dimensional arrangement coherence of the first UBM structures.

20. The semiconductor package of claim 19,
wherein a maximum width of each of the UBM structures is greater than a maximum width of each of the first conductive posts, and
wherein a thickness of each of the UBM structures is greater than a thickness of each of the at least one first redistribution layer.

* * * * *